(12) United States Patent
Kurokawa et al.

(10) Patent No.: US 6,861,905 B2
(45) Date of Patent: Mar. 1, 2005

(54) POWER AMPLIFIER SYSTEM AND MOBILE COMMUNICATION TERMINAL DEVICE

(75) Inventors: Atsushi Kurokawa, Higashimurayama (JP); Masao Yamane, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/768,160

(22) Filed: Feb. 2, 2004

(65) Prior Publication Data

US 2004/0155711 A1 Aug. 12, 2004

Related U.S. Application Data

(63) Continuation of application No. 09/530,878, filed on May 8, 2000, now Pat. No. 6,708,022.

(51) Int. Cl.[7] .................................................. H03F 3/16
(52) U.S. Cl. ........................................ 330/277; 330/307
(58) Field of Search ................................. 330/277, 285, 330/307; 257/280, 281, 282

(56) References Cited

U.S. PATENT DOCUMENTS

| | | | |
|---|---|---|---|
| 4,777,517 A | 10/1988 | Onodera et al. | 297/274 |
| 4,789,645 A | 12/1988 | Calviello et al. | 438/167 |
| 4,808,545 A | 2/1989 | Balasubramanyam et al. | 438/183 |
| 5,023,569 A | 6/1991 | Raven | 330/285 |
| 5,105,167 A * | 4/1992 | Peczalski | 330/295 |
| 5,160,898 A | 11/1992 | Black | 330/284 |
| 5,161,235 A | 11/1992 | Shur et al. | 257/24 |
| 5,327,583 A | 7/1994 | Yamada et al. | 455/572 |
| 5,408,198 A | 4/1995 | Kusunoki | 330/277 |
| 5,411,914 A | 5/1995 | Chen et al. | 438/167 |
| 5,516,725 A | 5/1996 | Chang et al. | 438/572 |
| 5,541,554 A | 7/1996 | Stengel et al. | 330/51 |
| 5,726,095 A | 3/1998 | Noble | 438/454 |
| 5,757,235 A | 5/1998 | Fujiwara et al. | 330/277 |
| 5,796,286 A | 8/1998 | Otaka | 327/308 |
| 6,005,267 A * | 12/1999 | Griffin et al. | 257/280 |
| 6,121,841 A | 9/2000 | Sakuno | 330/285 |
| 6,127,886 A | 10/2000 | Khabbaz et al. | 330/51 |
| 6,134,424 A | 10/2000 | Nishihori et al. | 455/127 |
| 6,545,563 B1 * | 4/2003 | Smith | 333/103 |

FOREIGN PATENT DOCUMENTS

| | | |
|---|---|---|
| JP | 59-95709 | 6/1984 |
| JP | 1-272307 | 10/1989 |
| JP | 8-222973 | 8/1996 |
| JP | 9-8061 | 1/1997 |

OTHER PUBLICATIONS

Nikkei Electronics, Nikkei BP Corp., Apr. 16, 1990, No. 497, p. 121.

* cited by examiner

*Primary Examiner*—Steven J. Mottola
(74) *Attorney, Agent, or Firm*—Mattingly, Stanger & Malur, P.C.

(57) ABSTRACT

A power amplifier system has a high frequency power amplifier circuit section employing source-grounded enhancement type n-channel MESFETs for receiving a drain bias voltage and a gate bias voltage of zero volts or positive low potentials supplied from a unipolar power supply, and amplifying a superposed input signal therewith to output an amplified signal indicative of a change in drain currents. An output matching circuit section applies impedance matching to the amplified signal and outputs the resultant signal. A gate bias voltage circuit section supplies a gate bias voltage to the high frequency power amplifier circuit. When a forward direct current gate voltage is applied to a gate terminal with a source terminal coupled to ground, the DC gate voltage becomes greater than or equal to 0.65 volts, the DC gate voltage causing a gate current value per gate width of 100 micrometers to exceed 100 microamperes.

20 Claims, 6 Drawing Sheets

POWER AMPLIFIER SYSTEM AND MOBILE COMMUNICATION TERMINAL DEVICE

This is a continuation application of U.S. Ser. No. 09/530,878, filed May 8, 2000 now U.S. Pat. No. 6,708,022. This application is related to U.S. Ser. No. 09/653,623, filed Aug. 31, 2000, now U.S. Pat. No. 6,678,507.

TECHNICAL FIELD

The present invention relates generally to power amplifier systems and mobile communications terminal devices, and more particularly to architectures suitably adaptable for use with high frequency power amplifier systems for over-the-air radiocommunications services using Schottky barrier gate metal semiconductor field effect transistors (MESFETS) made of compound semiconductor and also mobile communications terminal devices using the same.

BACKGROUND OF THE INVENTION

In portable or handheld mobile communications terminal devices such as personal digital cellular (PDC) or personal handyphone systems (PHS) or the like, radiocommunications are performed by use of carrier waves in microwave bands at frequencies of 1 gigahertz (GHz) or higher. Due to this, power amplifier circuitry for transmit signals and pre-amplifier circuitry for receive signals are typically designed to employ gallium arsenide (GaAs) MESFETs that operate at higher speeds than standard silicon transistors.

General teachings about mobile communications terminal devices are found in several printed publications including, for example, "NIKKEI ELECTRONICS," by Nikkei BP Corp., Apr. 16, 1990 (No. 497), p. 121.

While this mobile communications terminal device requires relatively large electrical power of approximately 1 watt (W) for over-the-air signal transmission, it is also required that the device be smaller in size and longer in operation time period on a battery in order to increase the portability of such mobile communications terminal. In view of this, use of battery-based single power supply drive scheme is preferable, which in turn requires low power consumption in a viewpoint of guarantee of long term operabilities.

Incidentally, in cases where GaAs MESFETS are utilized at high frequency bands, n-channel type MESFETS are generally employed in order to take full advantage of inherent significance of electron mobility therein. Accordingly, the following description will be devoted to the case of n-channel MESFETS, except as otherwise stated to the contrary.

In addition, in prior art MESFETs, those of the depression type that are relatively deep in threshold voltage (e.g. Vth=−1V, or more or less) are used in order to gain a significant amplification degree.

In case the MESFET of relatively deep Vth is used with its source grounded, it should be required that a gate bias of negative potential be applied thereto, which in turn requires separate use of a negative power supply voltage in addition to a positive power supply voltage. The amplifier system requiring such power supplies of both the positive and negative polarities is incapable of being driven by a single power supply—when an attempt is made to forcibly drive the system by using a single or unitary power supply, a specific scheme will be required for employing a DC-DC converter to generate from a positive power supply a negative voltage for use as the negative power supply.

Unfortunately the DC-DC converter employment scheme does not come without accompanying penalties as to an increase in power consumption and also an increase in parts mount area, which will become contradictory to the need for small size and long term battery drivability posed on mobile communications terminals.

Then, a need arises to consider employment of special circuitry for applying a gate bias voltage of zero volts or of positive polarity, which circuitry is typically designed to make use of certain GaAs MESFETs of either relatively shallow depression type or enhancement type with Vth being positive in polarity, as amplifying elements for use in a power amplifier circuit of mobile communications terminals.

In view of the fact that a GaAs MESFET constitutes a Schottky junction FET—in other words, a gate and source make up a Schottky diode—while an n-channel MESFET is used with its source grounded, application of a positive voltage to the gate would result in creation of a forward voltage with respect to the Schottky diode. This in turn makes it necessary that a positive voltage capable of application to the gate must be less than or equal to a specified voltage (Vf) at which a gate current (forward current) behaves to rapidly increase. This requirement comes because even upon applying a gate voltage of Vf or higher, a depletion layer underlying a gate electrode has already disappeared leading to an inability to control a drain current which can result in saturation of the drain current. On the other hand, a minimal value of the gate voltage capable of being applied in the negative direction becomes near or around the Vth value. This can occur because even when applying a gate voltage of less than or equal to Vth, a channel region has already been cut off by a depletion layer so that any drain current is no longer flowing therein.

In brief, while a linear region which permits the drain current to vary with a change in gate voltage is needed in order to take out the drain current of a MESFET as the intended amplified signal, the use of this region means that the gate voltage must fall within a limited range of from Vth to Vf.

Accordingly, when compared to a deep Vth depression type MESFET, MESFETs of the shallow Vth depression type or positive Vth enhancement type become narrower in range insuring gate voltage applicability. Generally the drain current gets larger when applying the gate voltage maximally; thus, the drain current tends to increase in amplitude in a way proportional to the amplitude of such gate voltage. Due to this, in the case of the MESFETs of relatively shallow depression type or enhancement type, it will possibly happen that any sufficient drain current is hardly obtainable. This would result in that the intended output or gain of the amplifier system is by no means attainable during a high frequency operation thereof, which leads to occurrence of a serious bar to the quest for higher performance in mobile communications terminals.

On the other hand, as has been recited in Japanese printed matter such as for example "COMPOUND SEMICONDUCTORS," Nikkan Kougyou Shinbun-Sha (this means in English "Daily Engineering Newspaper Corp."), Jan. 30, 1986 at p. 164, the current density, J, of a forward current flowing between a metal and a semiconductor that are in Schottky junction is given as:

$$J = A^* T^2 \exp(-q\phi_B/kT)(\exp(qV/nkT)-1),$$

where "A*" is the effective Richardson constant, T is the absolute temperature (K), q is the elementary charge carrier, $\phi_B$ is the Schottky barrier (V), k is the Boltzmann's constant, V is the applied voltage (V), and n is the ideal parameter or coefficient, which is expected to fall within a range of 1.0 to 1.3 when the Schottky junction is superior.

Assuming that exp (qV/nkT) is established and "n" is nearly equal to 1, the current density J behaves to increase exponentially at or near a point whereat V goes beyond $\phi_B$ as readily appreciated by those skilled in the art to which the invention pertains. Such situation is equivalent to the phenomenon that a gate current rapidly increases with an increase in gate voltage in source-grounded MESFETs. In short, Vf is strongly related to $\phi_B$—the greater $\phi_B$, the larger Vf. Accordingly, it may be considered that the use of those materials with large values of $\phi_B$, for the gate electrode is effective in order to increase the Vf value to thereby likewise increase the range of application of the gate voltage exhibiting amplification functionality.

Regrettably it has been known among experts in the art that even when a metal with Schottky junctionability is formed on the surface of GaAs, $\phi_B$ does not vary in accordance with the kind of a metal, that is, the work function of such metal, and thus $\phi_B$ remains almost constant. It is considered that this is owing to greatness of the surface energy level density on GaAs surfaces or alternatively pinning effects occurring due to creation of an intermediate layer.

In prior art n-channel GaAs MESFETs employed in many cases, the gate electrode is typically made of a tungsten silicide (WSi)-based material, wherein even if this gate electrode is modified to replace it with either aluminum (Al) or molybdenum (Mo) by way of example, the resultant Schottky barrier $\phi_B$ will never change significantly due to the presence of pinning effects. For this reason, it remains difficult to increase the gate voltage applicable range by increasing Vf, which in turn makes it difficult for those MESFETs of the relatively shallow depression type or enhancement type to provide a sufficient drain current for improvement in output or gain of the amplifier system during a high frequency operation thereof to thereby increase the performance of mobile communications terminals.

Additionally in cases where n-channel GaAs MESFETs of the relatively shallow depression type or enhancement type are employed with the source grounded, the resulting range of a gate voltage becomes narrower, which causes the stability of such gate bias voltage to significantly affect the signal-to-noise ratio (SNR) concerned. In view of this, the stability of power supply voltage will especially become important.

It is therefore an object of the present invention to improve the gain of a high frequency power amplifier system that is inherently designed to be driven by a single power supply.

It is another object of this invention to reduce electrical power as consumed by the high frequency power amplifier system.

It is still another object of the invention to improve the stability of such high frequency power amplifier system.

It is a further object of the invention to increase an output of a mobile communications terminal device offering drivability on a single power supply with low power consumption—namely capable of exhibiting long term operation on a battery—while improving performance.

These and other objects, features and advantages of the invention will be apparent from the following more particular description of preferred embodiments of the invention, as illustrated in the accompanying drawings.

DISCLOSURE OF THE INVENTION (1) A power amplifier system incorporating the principles of the present invention is a specific power amplifier system which employs as its amplifying element a Schottky barrier insulated gate field effect transistor also known as metal semiconductor field effect transistor (MESFET) with its source terminal coupled to the ground for receiving a drain bias voltage and a forward gate bias voltage of zero volts or low potentials as supplied from a unipolar power supply unit and for amplifying an input signal being superposed with the gate bias voltage to thereby generate and issue an output signal indicative of a change in drain current, wherein the MESFET is such that when a forward direct current (DC) gate voltage is applied to a gate terminal with a source terminal grounded, the DC gate voltage becomes greater than or equal in value to 0.65 volts (V), which voltage causes a gate current value per gate width of 100 micrometers ($\mu$m) to go beyond 100 microamperes ($\mu$A).

It has been stated that prior art MESFETs have a gate electrode typically made of tungsten silicides in many cases and that the Schottky barrier $\phi_B$ will not vary significantly even where such gate material is changed. As the methodology for evaluation of such Schottky barrier $\phi_B$, the inventors as named herein have been introduced a specific concept for defining as the Vf value strongly relating to $\phi_B$ the value of a DC gate voltage which permits a gate current value per gate width of 100 $\mu$m to exceed 100 $\mu$A in cases where a forward DC gate voltage is applied to the gate terminal with a source terminal coupled to ground.

More specifically, as the Schottky junction is established between the gate and the source as grounded, applying a forward voltage (positive voltage in the case of an n-channel MESFET) to the gate terminal results in a forward current flowing in the gate terminal at the current density J. As previously discussed, $$J=A^*T^2\exp(-q\phi_B/kT)(\exp(qV/nkT)-1),$$

and, under a condition that permits establishment of qV/nkT>3, that is, upon application of a certain gate voltage V, we obtain $$J = A*T^2\exp(-q\phi_B/kT)\exp(qV/nkT)$$
$$= \alpha\cdot\exp(-\beta\phi_B)\exp(\beta v/n),$$

where $\alpha=A^{**}T^2$, and $\beta=q/kT$. Hence, calculating the natural logarithm of the above equation, we have $$V=n\phi_B+(n/\beta)\ln(J/\alpha).$$

Here, let Vf be defined in the way stated above while assuming n=1, then $$Vf=\phi_B+(1/\beta)\ln(J_0/\alpha),$$

where $J_0$ is the gate current density equivalent to 100 $\mu$A per gate width of 100 $\mu$m. The inventors' evaluation through experimentation has reveled the fact that the term $(1/\beta)\ln(J_0/\alpha)$ may be approximated as 0. Thus, we finally obtain $Vf=\phi_B$.

Based on the definition above, the value Vf of prior art MESFETs adaptable for main use in prior art equipment, especially in mobile communications terminals, has been evaluated to demonstrate that Vf is 0.56 V in case a gate electrode of tungsten silicide was formed on GaAs and that the value of Vf stays at 0.6 V or less and hardly exceeds it.

In view of this fact, the present invention is for letting Vf in such definition be greater than or equal to 0.65 V to thereby widen or expand the range of a gate voltage capable of being applied as an input signal, thus increasing the amplitude of a drain current that may be derived as an amplified output. In other words, in accordance with the instant invention, it becomes possible to increase either an output or the gain of a power amplifier system employing a MESFET, thereby improving the performance of such system as a whole.

The ability to increase the output or gain of the power amplifier system in accordance with the invention will be set forth in detail with reference to FIGS. 1 to 3 below.

FIGS. 1–3 are graphs showing some characteristic curves for use in explaining an operation of a source-grounded n-channel MESFET in the power amplifier system of the invention, wherein FIG. 1 is a graph showing gate voltage (Vg) versus gate current (Ig) characteristics, FIG. 2 is a graph showing gate voltage (Vg) vs. drain current (Id) characteristics, and FIG. 3 is a graph showing drain voltage (Vds)-drain current (Ids) characteristics along with load curves.

In FIG. 1, a Vg-Ig curve 1 in case the Schottky barrier $\phi_B$ is significant indicates a MESFET to which the present invention is applied. On the other hand another Vg-Ig curve 2 in case the Schottky barrier $\phi_B$ stays less indicates a MESFET used as a comparison example through the inventors' experimentation for evaluation. As is apparent from the definition of the Vf stated above, a voltage providing a current value Ig0 equivalent to a current of 100 $\mu$A per gate width of 100 $\mu$m is Vf1 in the case of the curve 1, and is Vf2 in the case of curve 2. Experimental investigation made by the inventors has suggested that Vf2 is approximately 0.6 V whereas Vf1 is about 0.7 V for example.

From such Vg-Ig characteristics, the Vg-Id characteristics are as shown in FIG. 2. A curve 3 designates the Vg-Id characteristic of the MESFET incorporating the principles of the invention, wherein Id begins to flow when Vg goes beyond Vth and wherein Id increases with an increase in Vg within a range up to Vmax1. And Id is saturated when exceeding Vmax1. Vmax1 is substantially equal to Vf1 as stated supra. On the other hand, the case of the MESFET of the comparative example is indicated by a curve 4, wherein although Id begins flowing when Vg exceeds Vth in the same way as in the previous case, Id becomes saturated when exceeding Vmax2. Vmax2 is nearly equal to Vf2 from the definition of Vf. The graph of FIG. 2 also shows input and output signals simultaneously. Letting a gate bias voltage be represented by $V_0$, the maximum value of an input signal capable of being applied to the gate bias voltage as a gate voltage is Vmax1 in the case of application of the invention whereas the same is Vmax2 in the case of the comparative example. Accordingly the maximum value of the drain current acting as the intended output signal is Imax1 in the case of this invention whereas the same is Imax2 in the case of the comparative example. This may be summarized in a way such that the drain current of the invention capable of being extracted as an output increases from Imax2 up to Imax1 when compared to the comparative example.

This may be indicated by load curves as shown in FIG. 3. Specifically the MESFET of the present invention exhibits a load curve 5 which enables the gate voltage Vg to be applied up to about 0.7 V thereby making it possible to drive the drain current up to Imax1; on the contrary, the MESFET of comparative example has a load curve 6 with a limitation in applying the gate voltage Vg merely up to about 0.6 V, which in turn makes it impossible to drive the drain current of less than or equal to Imax2 at its upper limit. This investigation well demonstrates that use of the inventive teachings advantageously serves to increase a load current corresponding to a value of Imax1 minus Imax2 as compared to the comparative example while increasing the intended output accordingly.

Note here that although the consideration through experimentation made by the present inventors has revealed that the prior art MESFET measures about 0.6 V in Vf as discussed previously, this value is less than the value of $\phi_B$ (for WSi, $\phi_B$=0.75) as reported by the above-identified Japanese citation entitled "COMPOUND SEMICONDUCTORS," by Nikkan Kougyou Shinbun-Sha, Jan. 30, 1986, p. 165. The value Vf obtained by the inventors is observed to be less than such citation's value in this way, and this fact is due to the following reasons. The citation's value observation is such that electrode fabrication is done immediately after cleavage in vacuum environments in many cases, which encourages us to believe that the resulting value observed must be an "ideal" value obtained in the state that surfaces are kept extremely cleaned. In contrast, the Vf value measured by the inventors is a value that was observed in real devices, which might accompany certain contamination on the surfaces thereof. In addition, with such real devices, thermal processing is done after gate electrode fabrication processes, resulting in creation of reaction between a metal and semiconductor, which metal constitutes the gate electrode. Further, with the real devices, the gate length stays generally shorter; if this is the case, the so-called gate edge effects can enter causing a leakage current to often take place due to such edge effects. These factors are overlapped one another letting Vf be finally observed at the value less than that as taught by the above-identified Japanese citation.

In addition, said MESFET may be any MESFET of the shallow depression type or the enhancement type. Such sallow depression or enhancement type MESFET is inherently designed to apply as its gate bias voltage a forward voltage of zero volts or low potentials, which will be an important technique for use when driving by a single power supply; even in such a case, the invention permits application of the gate voltage up to Vf1 (Vmax1) thereby enabling provision of a sufficient output, which in turn makes it possible to compensate for demerits in the single power supply-driven power amplifier system.

It should be noted that the channel region of said MESFET is made of a chosen compound semiconductor material of the direct transition type. In accordance with this power amplifier system, it is possible by utilizing high carrier mobility of the direct transition type compound semiconductor to make up the intended power supply amplifier system capable of operating at high speeds. In particular, an n-channel MESFET using electrons as its majority carriers is most effective to the trend of achieving higher speeds and thus may be applied to amplification of high frequency signals of 1 GHz or more.

Additionally the direct transition type compound semiconductor may typically include aluminum gallium arsenide (AlGaAs) or alternatively gallium arsenide (GaAs), by way of example.

(2) The power amplifier system of the present invention is such that in the above noted power amplifier system, a circuit for supplying the gate bias voltage comprises more than one ripple filtering capacitor.

Letting the gate bias voltage supplying circuit comprise the ripple filter capacitor makes it possible to improve the stability of the power amplifier system. More specifically, with the power amplifier system of this invention, it is possible when applying an input signal as superimposed with the gate bias voltage to derive a drain current as an output current; however, a power supply for supplying this drain current is a single unipolar power supply unit, which power supply is also operable to generate a gate bias voltage. Upon supplying a drain current Id from the power supply, a potential drop of r·Id can occur at a power supply terminal due to the presence of an internal resistivity "r" of the power supply, thereby causing a gate bias voltage generator circuit also to suffer from appreciable influence of this potential drop. Especially with the power amplifier system of the invention, the potential drop r·Id's influence becomes greater because of the fact that the applicable range of the gate voltage is expanded to increase a drain current capable of being taken out as the intended output. In view of this, with the invention, the gate bias voltage generator circuit is specifically designed to come with the ripple filter capacitor for preventing unwanted overlapping or mixture of high frequency noises into the gate bias voltage, thus increasing the stability of gate bias voltage. This makes it possible to well stabilize an operation of the power amplifier system. In addition, with the power amplifier system of this invention, requirement for the use of the unipolar power supply leads to a decrease in range capable of applying the gate voltage. Due to this, the resultant amplitude of an input voltage signal must be made smaller accordingly while at the same time causing the stability of the gate bias voltage relative to the input signal to become more severe relatively; thus, the effect of the ripple filter capacitor of the invention will become more significant.

Also note that the ripple filter capacitor is provided outside of a semiconductor substrate with the MESFET formed thereon. While the practical capacitance value of such ripple filter capacitor will be explained later in the description, such value is generally large; when an attempt is made to realize it by IC microfabrication technologies on the semiconductor substrate, the resulting formation area can become greater resulting in an increase in IC production costs. Hence, letting the ripple filter capacitor or capacitors be provided separately outside of the semiconductor substrate makes it possible to constitute the intended power amplifier system at low costs.

(3) The power amplifier system of the instant invention is such that in said power amplifier system, a layer made from an alloy of a metal constituting the gate electrode and a semiconductive material making up a channel region is formed at the interface between said MESFET's gate electrode and channel region.

In accordance with this power amplifier system thus arranged, it is possible to achieve an improved MESFET structure with Vf of 0.65 V or greater. With prior art MESFETs used in many cases, certain materials that hardly form any alloys in combination with semiconductor such as tungsten silicides have been chosen for use as the gate electrode to thereby attain thermal stabilities or alternatively utilizabilities of thermal processing steps during manufacturing procedures. On the contrary, with the present invention, it is proposed to force the material constituting the gate electrode and the semiconductor in the channel region to actively thermally react with each other thus forming an alloy layer at the interface therebetween. Forming such alloy layer in this way permits the intended Schottky junction to be formed between this alloy layer and the semiconductor in the channel region, thereby enabling reduction of any appreciable influence or interference of an interface energy level that exists at the interface between the semiconductor in channel region and the gate electrode metal. This in turn makes it possible to avoid occurrence of pinning effects thereby enabling formation of the Schottky barrier $\phi_B$ in a way pursuant to the work function of such material. Whereby the Schottky barrier $\phi_B$ may be made greater to likewise increase Vf in value. In addition, as the alloy layer is formed in advance or "pre-formed," the resulting thermal stability may also be increased. This in turn makes it possible to improve the operation reliability of the power amplifier system.

Another feature of the invention lies in that said alloy layer is formed at a level lower than the surface of the channel region. Forming the alloy layer at the specified level underlying the channel region surface in this way makes it possible to further reduce the influence of the interface energy level that can cause pinning effects.

A further feature of the invention is that said metal has its work function greater than the work function of tungsten suicides. As previously stated, the Schottky barrier $\phi_B$ between the alloy layer and the semiconductor is determinable depending on the work function of such alloy layer in the state that the pinning effects are suppressed. Due to this, while suppressing pinning effects, use of the scheme stated supra let the metal have its work function greater than that of tungsten silicides whereby the resultant Schottky barrier $\phi_B$ increases thus enabling achievement of the value of Vf which is greater than or equal to 0.65 V. Practically, the metal may preferably be either platinum (Pt) or palladium (Pd). These metals per se are significant in work function; an alloy of these metals and a semiconductor material such as for example arsenic is also great in work function, which in turn allows formation of a significant Schottky barrier $\phi_B$ at the junction interface between platinum arsenide (PtAs) and GaAs.

Increasing the Schottky barrier $\phi_B$ in this way will also contribute to reduction of possible leakage currents between adjacent channels. This may result in a decrease in electrical power as consumed by the power amplifier system.

Additionally, although forming the alloy layer using either platinum or palladium may increase Vf in value in the way as previously stated, it has been affirmed through experimental investigation made by the present inventors that this Vf value is also variable depending upon semiconductive materials used for the channel region. More specifically, in the event that AlGaAs is employed as the semiconductor material while letting the gate electrode be made of platinum for example, Vf is at least 0.70 V or greater—typically, 0.75 V or more or less. Alternatively in case GaAs is used as the semiconductor material while letting the gate electrode be made of platinum for instance, Vf is at least 0.65 V or more—typically, falls within a range of from 0.67 to 0.73 V. It may be considered that the Vf value behaves to vary between AlGaAs and GaAs are based on the presence of a difference in electron affinity therebetween. Additionally, Vf tends to exhibit distributivities in the range of 0.67 to 0.73 V even where GaAs is equally employed due to differences in thickness of platinum. To be more specific, in the case of employing platinum as thin as 70 to 80 Angstroms (A), Vf ranges in value from 0.67 to 0.69 V; in case platinum is as thick as 300 A then Vf ranges from 0.72 to 0.73 V.

(4) The power amplifier system of this invention is such that in said power amplifier system, MESFETs involved are formed in a way separated from one another in units of semiconductor substrates while at the same time causing MESFETS and passive elements to be arranged separately from each other; or alternatively, MESFETs and more than one passive element making up amplifier circuitry are fabricated and integrated together on a single semiconductor substrate; or still alternatively, MESFETs and passive elements constituting such amplifier circuitry plus output matching circuitry operatively associated with the amplifier circuitry are all integrated together on a single semiconductor substrate.

In other words the power amplifier system of the invention is configurable in a discrete form while letting only part of amplifier circuitry be integrated into an IC chip (typically the one known as monolithic microwave IC or "MMIC") package or alternatively microfabricating it into such IC chip along with output matching circuitry operatively associated therewith.

(5) The power amplifier system of the invention is a mobile communications terminal device having a power amplifier circuit including a compound semiconductor MESFET for use as an active element for amplifying and outputting a high frequency signal, the MESFET having a source coupled to ground, a unipolar power supply for supplying the compound semiconductor MESFET with a drain bias voltage and a gate bias voltage, and an output matching circuit of the power amplifier circuit, featured in that the compound semiconductor MESFET permits, upon application of a forward DC gate voltage to a gate terminal with its source terminal grounded, the DC gate voltage to be greater than or equal in value to 0.65 V, the DC gate voltage causing a gate current value per gate width of 100 $\mu$m to go beyond 100 $\mu$A.

In addition, said gate bias voltage supply circuit may be arranged to comprise one or more ripple filtering capacitors that are provided outside of a semiconductor substrate with more than one MESFET formed thereon; further, said compound semiconductor MESFET includes a layer which is made from an alloy of a chosen metal and compound semiconductor and which is formed at the interface between the MESFET's gate electrode and channel region made of compound semiconductor, the chosen metal including platinum (Pt) or palladium (Pd).

In accordance with such mobile communications terminal device thus arranged, a unipolar power supply unit may be used to successfully drive the power amplifier circuit while simultaneously enabling increase in output of the power amplifier circuit thus improving the performance of the mobile communications terminal device.

Technical advantages obtainable by some representative ones of the inventive teachings and features as disclosed above will be explained in brief summary as follows.

(1) It is possible to improve the gain of the high frequency power amplifier system inherently designed to operate with a unipolar power supply for driving the same.

(2) It is possible to reduce power consumption of the high frequency power amplifier system.

(3) It is possible to improve the stability of such high frequency power amplifier system.

(4) It is possible to increase the output of a mobile communications terminal device capable of being driven by a unipolar power supply at low power consumption levels, that is, capable of offering enhanced battery-use drivabilities for extended periods of time.

BRIEF DESCRIPTION OF THE DRAWINGS

FIGS. 1 to 3 are graphs showing some characteristic curves for explanation of an operation of a source-grounded n-channel MESFET in a power amplifier system of the present invention, wherein FIG. 1 is a graph showing gate voltage (Vg) versus gate current (Ig) characteristics, FIG. 2 is a graph showing gate voltage (Vg) vs. drain current (Id) characteristics, and FIG. 3 is a graph showing drain voltage (Vds)-drain current (Ids) characteristics along with load curves.

BEST MODES FOR CARRYING OUT THE INVENTION

The present invention will be explained in detail with reference to the accompanying drawings below.

Figure 4:
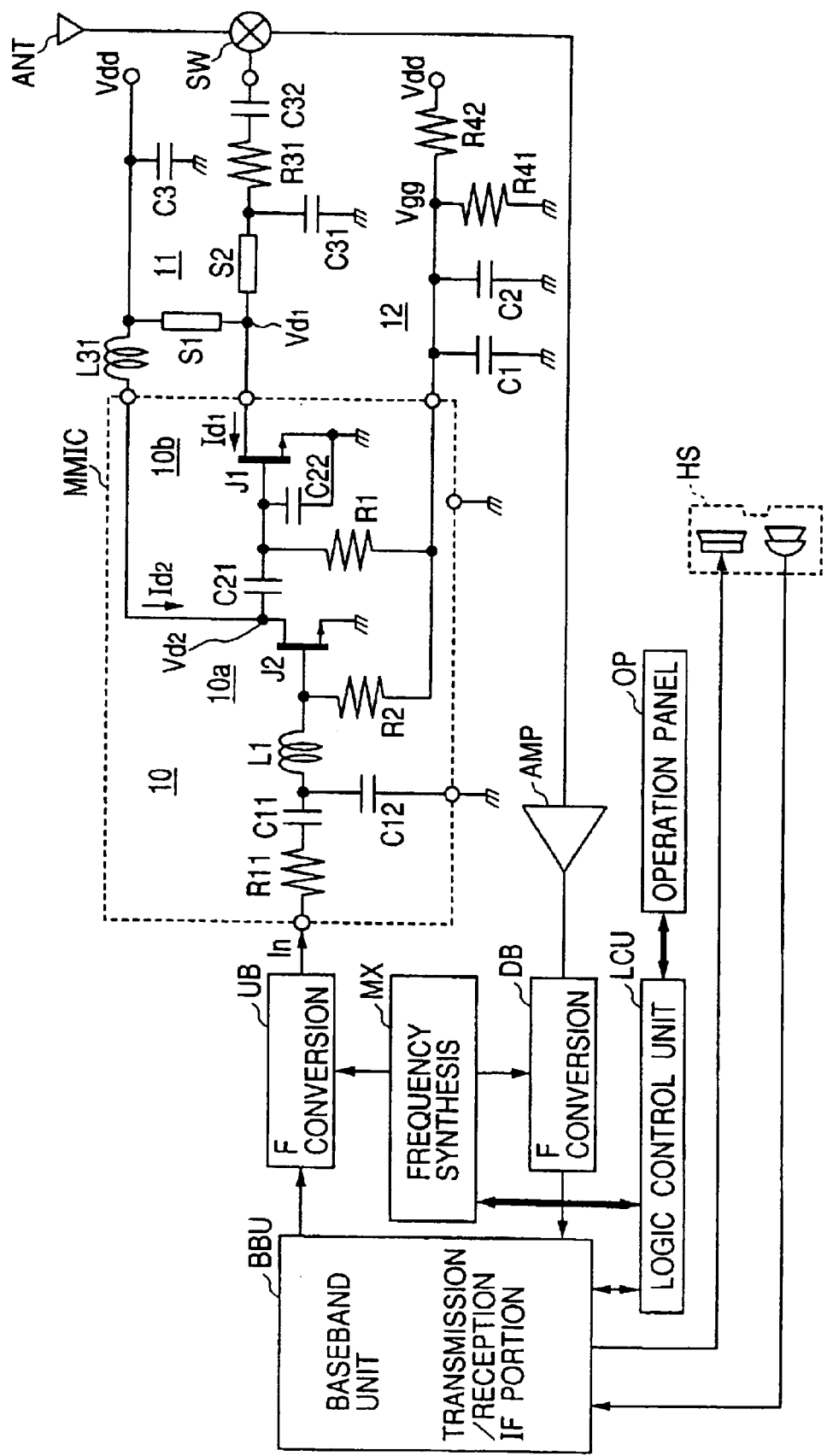
FIG. 4 is a diagram showing a configuration of one example of the power amplifier system and a mobile communications terminal device employing the system therein.

FIG. 4 is a diagram depicting a configuration of an exemplary power amplifier system of this invention and a mobile communications terminal device employing the system.

The mobile communications terminal device embodying this invention is generally constituted from a power amplifier system which includes a high frequency power amplifier circuit unit 10 for power amplification of a high frequency signal to be transmitted, an output matching circuit unit 11 for performing impedance matching of an amplified high frequency signal and then outputting the same, and a gate bias voltage circuit unit 12 for supplying a gate bias voltage to the high frequency power amplifier circuit unit, a high frequency wave receive pre-amplifier AMP, a branching filter (or alternatively antenna switcher) SW, an over-the-air radio transmit/receive antenna ANT, a transmitter side frequency converter circuit (upverter) UB, a receiver side frequency converter circuit (downverter) DB, a frequency combiner/synthesizer circuit MX for generating a local signal used for frequency conversion, a baseband unit BBU containing therein a transmit/receive interface (IF) unit, a logical control unit LCU, an operation panel OP involving an operation unit and display unit, a head set HS consisting essentially of an audio/voice telephone transmitter and a receiver, and a built-in battery module for use in supplying an operation voltage Vdd of the overall device. In the illustrative embodiment a single unitary built-in battery is provided as the power supply, which may typically be a lithium battery of output voltage of 3.5 V.

The high frequency receive preamplifier AMP is operable to amplify a radiofrequency signal as received at the radio transmit/receive antenna ANT to provide an amplified signal which is then converted at the receiver side frequency converter circuit (downverter) DB into a low frequency signal for transmission to the baseband unit BBU. The baseband unit BBU operates to execute signal processing of the low frequency receipt signal and then transfers a resultant processed signal to the headset HS via the IF unit, and thereafter is output from the voice receiver of such headset HS as an audio/voice signal.

On the other hand, an audio signal as detected by the telephone transmitter of the headset HS is transferred via the IF unit to the baseband unit BBU, subjected to signal-processing at the baseband unit BBU, and then converted by the transmitter side frequency converter circuit (upverter) UB into a high frequency transmit signal. The high frequency transmit signal is input to an input In of the power amplifier system and then subject to power amplification thereat to thereby generate an amplified high frequency output signal, which is impedance-matched at the output matching circuit unit 11 of the power amplifier system and is then sent forth toward the radio transmit/receive antenna ANT.

The radio transmit/receive antenna ANT is such that both of a transmit signal and receive signal are input and output to and from it; accordingly, either such transmit or receive signal is to be subject to branch-filtering at the branching filter (or alternatively antenna switcher) SW. In addition, in deference to an operation from the operation panel OP, the logical control unit LCU operates to control the baseband unit BBU and frequency synthesizer circuit MX thereby permitting necessary information to be visually displayed on the display unit of the operation panel OP.

The power amplifier system of the illustrative embodiment has the high frequency power amplifier circuit unit 10, output matching circuit unit 11, and gate bias voltage circuit unit 12.

The high frequency power amplifier circuit unit 10 is configured from multiple stages including a pre-stage 10a and post-stage 10b.

The prestage 10a includes a source-grounded enhancement type GaAs MESFET J2 and an input circuit that includes a resistor R11, capacitors C11–C12 and inductor L1. The resistor R11 and capacitor C11 plus inductor L1 are series-connected together to have one end serving as the input In and the other end connected to a gate of the MESFET J2. The capacitor C12 has its one end coupled to ground for letting an input of the prestage 10a be grounded in an alternate current (AC) sense. The MESFET J2 has its drain connected to the inductor L31 acting as a load impedance and thus is used as an input of the post-stage 10b.

The post-stage 10b is arranged to include a source-grounded enhancement type GaAs MESFET J1 and capacitors C21, C22 operatively associated therewith. The capacitor C21 is serially connected between the drain of MESFET J2 serving as an output of the prestage 10a and the gate of MESFET J1, for establishing direct current (DC) separation or isolation between the prestage 10a and post-stage 10b. The capacitor C22 has one end coupled to ground for letting the poststage 10b's input be AC-grounded. The MESFET J1 has its drain connected to a strip element S1 that becomes part of the load impedance, which also becomes an input of the output matching circuit unit 11 as an output of the poststage 10b, i.e. an output of the high frequency power amplifier circuit unit 10.

The drains of the MESFETs J1, J2 are connected to the power supply voltage potential Vdd through the strip element s1 and the inductor L31 respectively. A capacitor C3 of large capacitance value (e.g. 2,000 pF) is connected to a power supply line for potential stabilization.

The output matching circuit unit 11 includes strip elements S1–S2, a resistor R31, and capacitors C31, C32. The output matching circuit unit 11 is adjusted so that its characteristic impedance is at 50 Ω.

The gate bias voltage circuit unit 12 is generally configured from a pull-up resistor R42 from the power supply voltage Vdd, a resistor R41 for determination of the value of a gate bias voltage Vgg, ripple filtering capacitors C1, C2 that are connected between a line of the gate bias voltage Vgg and the ground. Note here that the gate bias voltage Vgg is applied to respective gates of the MESFET J1, J2 via the resistors R1, R2 respectively.

Additionally the high frequency power amplifier circuit unit 10 of this embodiment is arranged as a monolithic microwave integrated circuit (MMIC). More specifically, the components R1–R2, R11, C11–C12, C21–C22 and L1 are fabricated and integrated on a GaAs substrate with the MESFETs J1, J2 formed thereon in such a manner that these are in the form of an IC structure. The resistors including R1 and the like may be semiconductor resistors utilizing epitaxial layers and/or ion-implantation layers or alternatively metal coat film resistors, by way of example. The capacitors such as C11 or else may be metal insulator metal (MIM) capacitors, interdigital capacitors or other similar suitable capacitive elements. The inductor of L1 may be a meander-line or spiral-line inductor or else, for example.

Some practically implementable numerical values of the above-noted circuitry are exemplified as follows. R11=15 Ω C11=3.0 pF, C12=1.4–1.6 pF, L1=2–15 nH (preferably 5 nH), R2=400 Ω, C21=3–5 pF (preferably 3.9 pF), R1=100Ω, C11=0.5 pF, L31=0.01 nH, R31=1Ω, C31=5 pF, C32=8 pF, R41=0.2 kΩ, R42=3.3kΩ.

Figure 5:
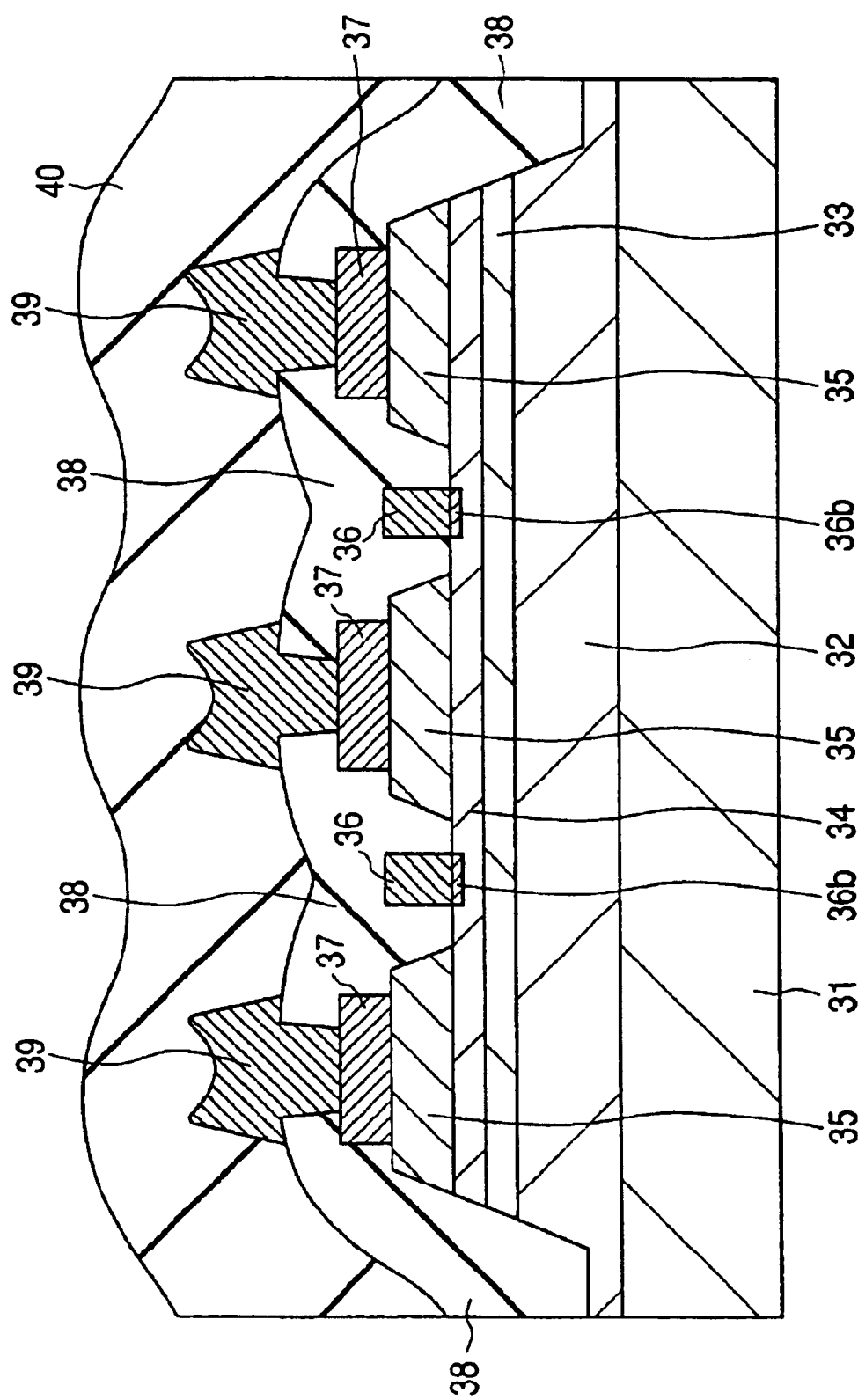
FIG. 5 is a cross-sectional diagram showing one exemplary GaAs n-channel MESFET for use in the power amplifier system embodying the invention.

An explanation will next be given of the structure of MESFET J1, J2 in conjunction with FIG. 5. FIG. 5 is a cross sectional diagram showing one example of the GaAs n-channel MESFET for use in the power amplifier system embodying the invention.

A GaAs substrate 31 has its top surface on which a buffer layer 32 is formed to have a multilayer structure of a plurality of layers made of AlGaAs and GaAs laminated over one another, wherein an InGaAs layer 33 acting as a channel and an n-type AlGaAs layer 34 for use as an electron supply layer are formed overlying the buffer layer in this order.

An n-type GaAs layer 35 is formed on the n-type AlGaAs layer 34 in such a way that the layer 35 is partly opened to define therein several "islands" for use as source/drain regions; gate electrodes 36 are formed on the AlGaAs layer 34 in specified locations each of which lies midway between adjacent ones of the islands of the n-type GaAs layer 35. In addition, source/drain electrodes 37 are formed on the upper surfaces of respective islands of the n-type GaAs layer 35, which electrodes are made of a chosen conductive material that contains gold (Au) as its principal component.

The source/drain electrodes 37 and gate electrodes 36 are covered by a dielectric film 38 that is formed for example of a silicon oxide film, with electrical leads 39 being formed in those connection holes that are defined as openings in the dielectric film 38. Furthermore, the leads 39 are covered by a protective insulation film 40 formed of a silicon oxide film for example.

The buffer layer 32, InGaAs layer 33, n-type AlGaAs layer 34 and n-type GaAs layer 35 may be deposited by epitaxial growth methods for example. Deposit on the n-type GaAs layer 35 a metal that will later be used as the source/drain electrodes 37; apply etching treatment to the layer thereby machining it into a prespecified form; perform thermal processing to provide ohmic contacts; etch thereafter the n-type GaAs layer 35 into a specified form; deposit a metallic film for later use as the gate electrodes 36; and then, etch such deposited film to fabricate the gate electrodes 36. Thereafter, etch the n-type GaAs layer 35, n-type AlGaAs layer 34, InGaAs layer 33 and buffer layer 32; deposit the dielectric film 38; form connection holes at selected positions; deposit a metal film that will become the leads 39; pattern this to form leads 39; and further deposit the protective dielectric film 40 thereby fabricating the MESFETs J1, J2 stated supra.

The gate electrodes 36 of the MESFETs J1, J2 are each formed of a metal film having at least platinum; for instance, it may be a multilayered film with a lamination of platinum/titanium/molybdenum/titanium/platinum/gold in this order of sequence from the lowermost layer thereof. Additionally, after having performed the processing of the gate electrodes 36, thermal processing is done to form a layer 36b made from an alloy of platinum and arsenic through chemical reaction between the platinum and the n-type AlGaAs layer 34. This alloy layer 36b is such that its bottom part is lower in level than the surface of n-type AlGaAs layer 34 to come closer or "sink" toward the channel side.

By forming the platinum/arsenic alloy layer 36b while letting the constituent layers of the gate electrodes 36 contain therein at least platinum, it becomes possible to increase a Schottky barrier of Schottky junction as will be formed between the gate electrodes 36 and the channels of MESFETs J1, J2. This makes it possible to permit the aforesaid Vf to increase in value. In addition, due to the fact that the alloy layer 36b is specifically designed so that its bottom part "sinks" from the surface of n-type AlGaAs layer 34 toward the channel side, it is possible to reduce the influence of a surface energy level at the surface thereby suppressing creation of pinning effects, which in turn makes it possible to allow the resultant Schottky barrier to increase accordingly.

Experimentation made by the inventors as named herein has revealed that said defined Vf of these MESFETs J1, J2 thus fabricated measures 0.75 V. This value is greater than a prior reported value of 0.6 V, which is obtainable in cases where the gate electrodes are made of tungsten silicides typically employed for representative MESFETs. Whereby, even when accepting the presence of certain margins of 0.05 V, it becomes possible to apply a gate voltage up to 0.7 V, which makes it possible to increase drain currents of the MESFETs J1, J2, thereby enabling improvement in gain and output of the power amplifier system while permitting the mobile communications terminal device to likewise increase in performance.

Another advantage of this embodiment is that enhanced thermal reliability is obtainable due to the fact that the gate electrodes 36 of MESFETS J1, J2 are fabricated through thermal processing while arranging the alloy layer 36b so that its bottom part sinks from the surface of n-type AlGaAs layer 34 toward the channel side, thus enabling improvement in reliability of the power amplifier system and the mobile communications terminal device employing the same.

It should be noted that the MESFETs J1, J2 may be designed to measure 32 mm and 8 mm in gate width respectively.

An explanation will next be given of an operation of the power amplifier system below.

A high frequency or radiofrequency signal as output from the transmitter side frequency converter circuit (upverter) UB is applied to the input In as an input of the high frequency power amplifier circuit unit 10. The radiofrequency input signal is subject to impedance adjustment at the resistor R11 and inductor L1 and is then superposed into a DC gate bias voltage Vgg for application to the gate of the MESFET J2. At this time the gate bias voltage Vgg is DC-isolated by the capacitors C11, C12 from the input In and the ground potential to ensure that such voltage is applied as a bias to the gate of the MESFET J2. Additionally the radiofrequency input signal is grounded by the capacitor C12 in a high frequency viewpoint.

Figure 1:
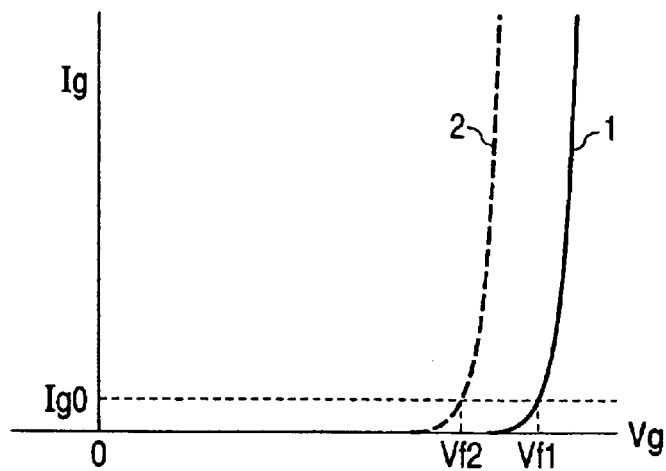
Figure 2:
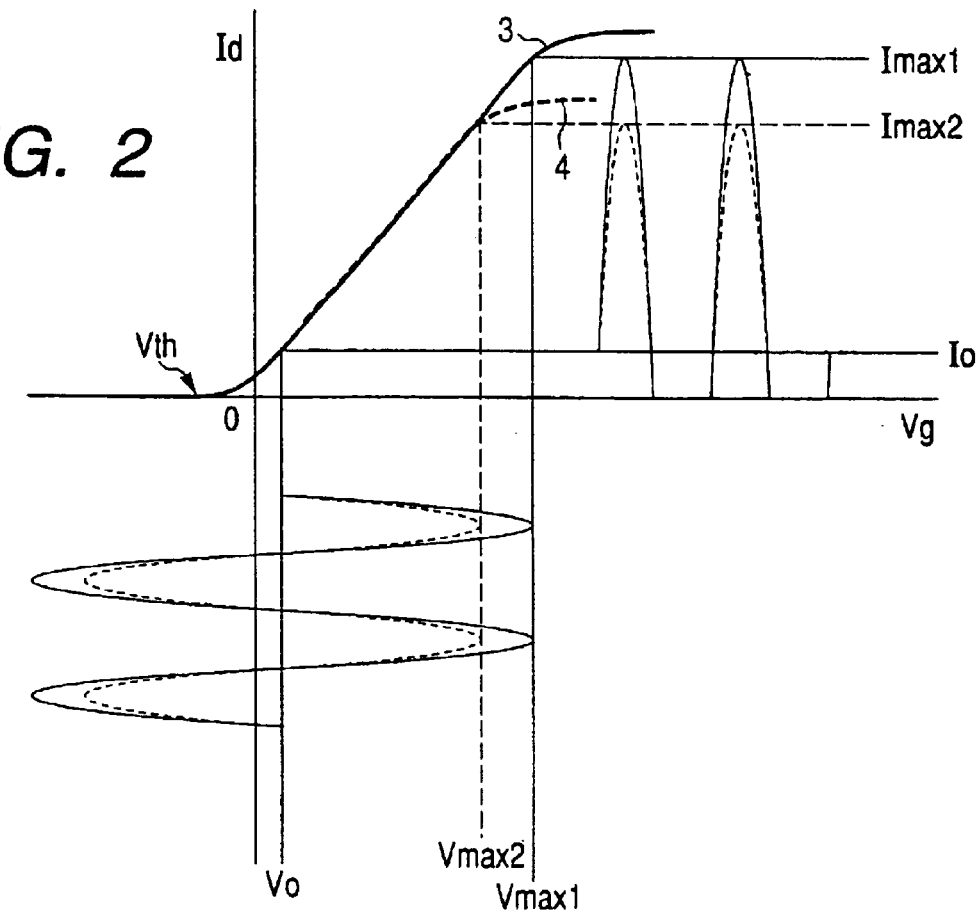
Figure 3:
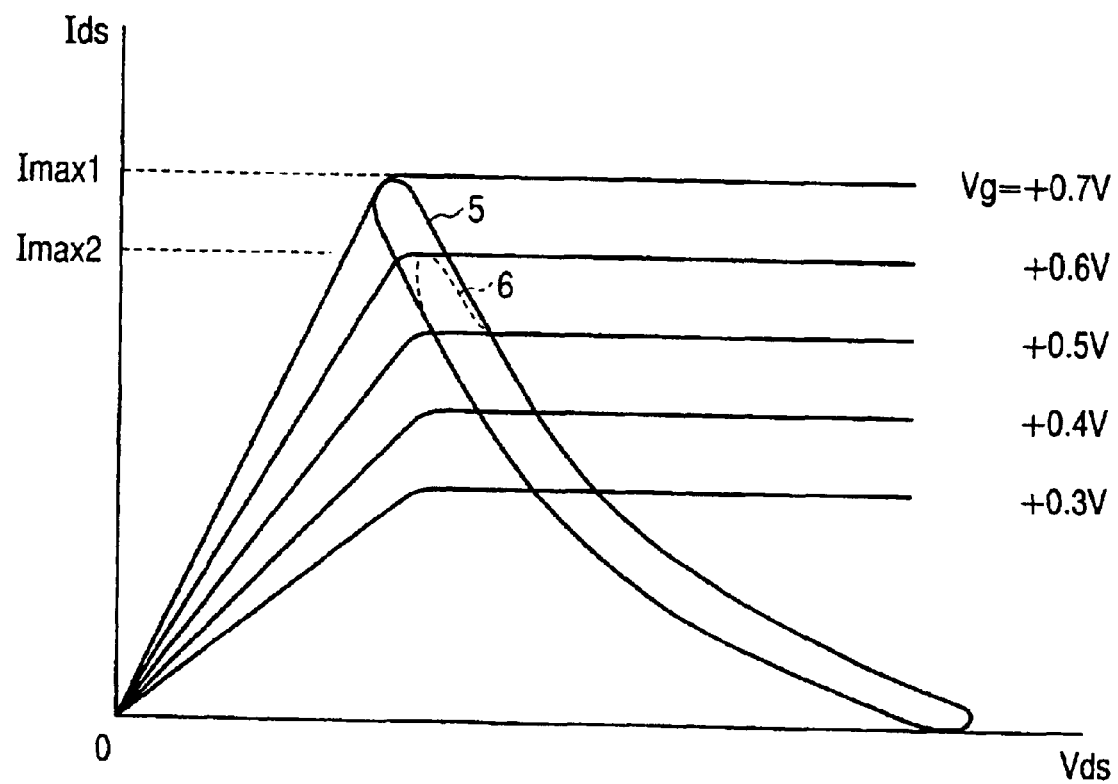

In accordance with the gate voltage being presently applied to the gate of MESFET J2, a drain current Id2 of MESFET J2 rushes to flow. This is as has been explained by use of FIG. 2. At this time the drain current Id2 may be a large current because of the fact that a voltage applicable to the gate voltage is as large as 0.7 V.

As the drain of the MESFET J2 is potentially pulled up by the inductor L31 to the power supply voltage Vdd, a drain voltage Vd2 in accordance with the drain current Id2 (i.e. amplified signal obtained through amplification of a radiofrequency input signal) will be generated. The drain voltage Vd2 is an amplified signal of the prestage 10a as produced through amplification of the radiofrequency input signal, which will then be applied as an input of the post-stage 10b to the gate of the MESFET J1.

The MESFET J1 receives at its gate a gate voltage with the drain voltage Vd2 and gate bias voltage Vgg superposed together. The gate bias voltage Vgg is DC-isolated by the capacitors C21, C22 from both the prestage 10a and the ground potential to thereby ensure that this voltage is applied as a bias to the gate of MESFET J1. Additionally the drain voltage Vd2 is grounded by the capacitor C22 in a radiofrequency viewpoint.

In accordance with the gate voltage being applied to the gate of the MESFET J1, a drain current Id1 of MESFET J1 flows. This is also as has been explained by use of FIG. 2. At this time the drain current Id1 may be a large current because a voltage applicable to the gate voltage is as large as 0.7 V.

Since the drain of MESFET J1 is potentially pulled up by the strip element S1 up to the power supply voltage Vdd, a drain voltage Vd1 pursuant to the drain current Id1 will take place. The drain voltage Vd1 is an amplified signal of the high frequency power amplifier circuit unit 10, which is obtained through amplification of the drain voltage Vd2 serving as an input signal to the post-stage 10b.

The output matching circuit unit 11 is provided to guarantee that the radiofrequency signal represented by the drain current Id1 and drain voltage Vd1 is effectively power-supplied to the radio transmit/receive antenna ANT. As well known among those skilled in the art to which the invention pertains, an operation of the output matching circuit unit 11 is designed in a way such that an output impedance of the high frequency power amplifier circuit unit 10 matches an input impedance of ANT.

With the embodiment under discussion herein, it is also one of the principal features of the present invention that the gate bias voltage circuit unit 12 is equipped with the ripple filtering capacitors C1, C2.

In this embodiment the gate bias voltage Vgg is generated from the power supply voltage Vdd due to the fact that the power supply as used therein is constituted from a unipolar battery module alone. The gate bias voltage Vgg is produced by a voltage across the both ends of R41 due to a serial connection of the pullup resistor R42 and resistor R41. As the resistance values of R42 and R41 are 3.3 k$\Omega$ and 0.2 k$\Omega$ respectively, Vgg=0.2·Vdd/(3.3+0.2) where Vdd=+3.5 V; thus, Vgg=0.2 V is obtained.

Note however that as Vgg is generated from Vdd, a variation of Vdd can occur directly as a variation of Vgg. More specifically, since in this embodiment the drain currents Id1, Id2 of MESFETs J1, J2 stay larger in value, a current flowing in the battery, (Id1+Id2), will likewise increase resulting in creation of a potential drop due to the presence of an internal resistivity "r" of such battery, which may be given as r·(Id1+Id2). This potential drop will automatically be superposed as a high frequency potential variation (noises) to Vgg due to a resistor-divided voltage. To avoid this, the embodiment is designed to come with the ripple filtering capacitors C1, C2 for filtering out such noises.

The capacitance values of C1, C2 may be set at 55 pF and 1000 pF, respectively. Letting high frequency noises be set at 1.9 GHz in frequency, the capacitor C1's impedance becomes about 1.5Ω as Z=1/(2πf·C). Establishment of this value means that it is possible to permit, for the gate of MESFET J1, more than 98% of high frequency noises to be flown or "dumped" to the ground, which is determinable by a ratio relative to a resistor of R1=100Ω as coupled thereto, while simultaneously forcing, for the gate of MESFET J2, mote than 99.5% of radiofrequency noises to be dumped to the ground, which is definable by a ratio relative to a resistor of R1=400Ω coupled thereto.

Additionally the impedance of the capacitor C2 is theoretically expected to become a further lower impedance at a frequency of f=1.9 GHz; however, from a viewpoint of practical implementation, the influence of a serial-coupled resistor and inductor enters due to the fact that the capacitance value is as large as 1000 pF. This would result in that it measures approximately 5Ω at f=1.9 GHz, which makes it no longer expectable to attain any intended filtering effects. On the contrary, a value 0.8Ω or more or less is obtainable with respect to those noises at frequencies lower than f=1.9 GHz, e.g. f=0.19 GHz; this makes it possible to dump about 98% or more of high frequency noises to the ground even with respect to the gate of MESFET J1.

Consequently, as such ripple filtering capacitors C1, C2 are specifically employed to let a line of gate bias voltage Vgg be connected to the ground potential, any possible high frequency noises are forced to flow via the ripple filter capacitors C1, C2 into the ground thereby stabilizing the gate bias voltage Vgg being applied to the gates of MESFETs J1, J2, which in turn enables achievement of enhanced stability during an amplifying operation of the power amplifier system. This makes it possible to permit the mobile communications terminal device to exhibit improvement in performance. Especially in the power amplifier system of this embodiment, since its gate voltage applicable range is narrower than that of deep-depression type MESFETs, the stability of the gate bias voltage is important so that the ripple filter capacitors C1, C2 embodying the invention are effective.

Note that the values of the ripple filter capacitors C1, C2 are readily modifiable in connection with the values of the resistors R1, R2 as connected to the gates of the MESFETs J1, J2. Accordingly, it would readily occur to those skilled in the art that the aforesaid values of ripple filter capacitors C1, C2 should not be fixed only to such values and may be changed in accordance with the values of resistors R1, R2 used. It would also be appreciated by experts that the values of ripple filter capacitors C1, C2 are modifiable in accordance with the stability required.

An explanation will be given of how the power amplification ratio is actually improved in the above-noted power amplifier system based on numerical analysis results given below.

For instance, suppose that a MESFET to be compared measures 0.65 V in value of Vf. In this case the MESFETs J1, J2 of the illustrative embodiment are such that Vf is 0.75 V. Thus, assuming that an output of a power amplifier system under comparison is 1.2 W, an output of the embodiment power amplifier system is given as, $$((0.7-0.2)^2/(0.6-0.2)^2) \times 1.2 \text{ W} = 1.8 \text{ W}.$$

Note here that in view of possible variations of Vf, the amplitude of a gate voltage is set at 0.60 V for the comparative example whereas the same is 0.70 V for the embodiment.

In this way, the power amplifier system of this embodiment is capable of exhibiting 50% increase in output thereof.

Figure 6:
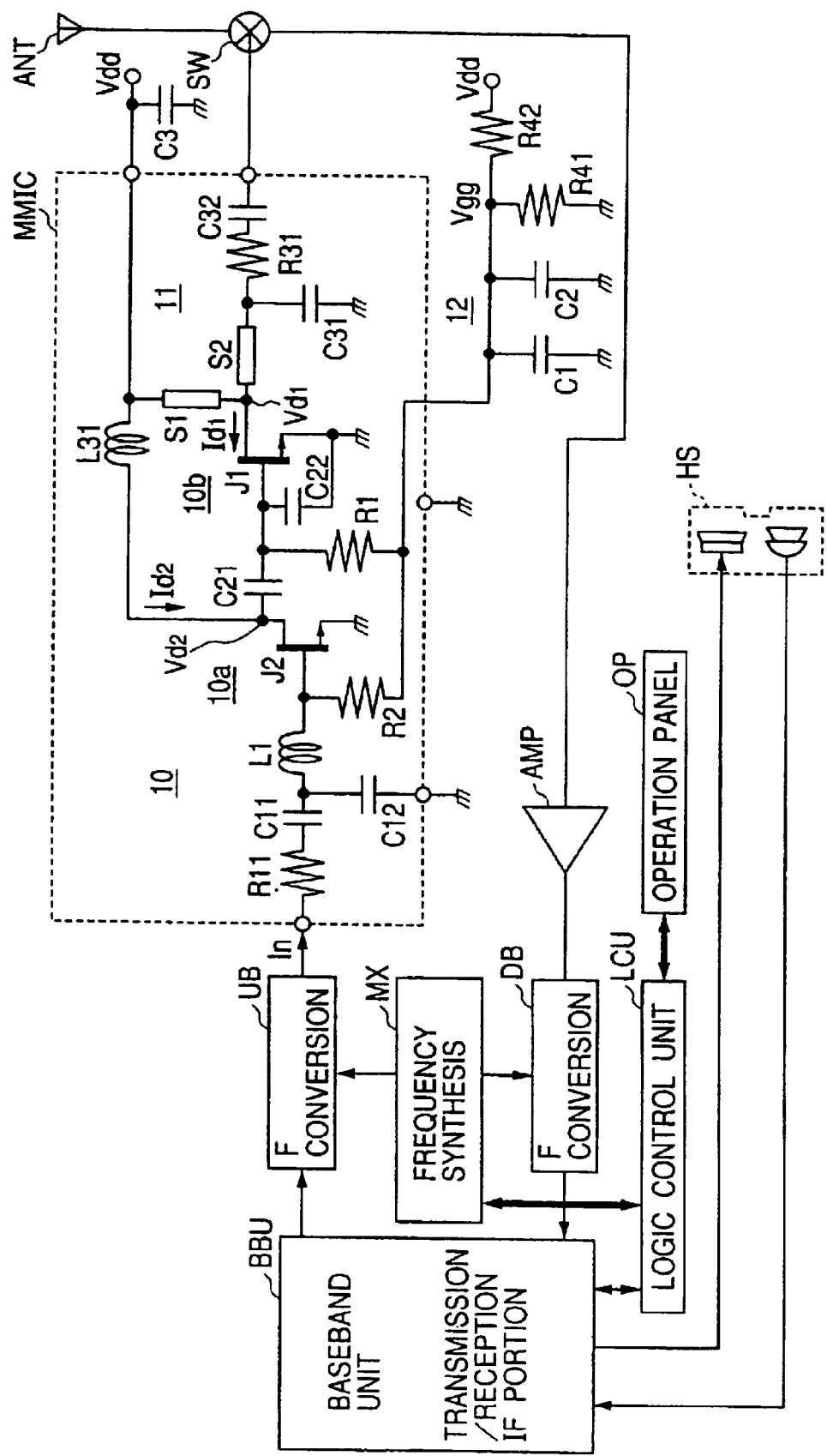
FIG. 6 is a diagram showing a configuration of another exemplary power amplifier system and a mobile communications terminal device incorporating this system.

FIG. 6 is a diagram depicting a configuration of another exemplary power amplifier system and a mobile communications terminal device incorporating this system therein. The power amplifier system and the mobile communications terminal device employing this system shown in FIG. 6 are generally similar in functionality to those shown in FIG. 4. A difference of the former from the latter is that the high frequency power amplifier circuit unit 10 and output matching circuit unit 11 are integrated together into an MMIC. The gate bias voltage circuit unit 12 is externally provided outside of the MMIC. In the power amplifier system and the mobile communications terminal device using the same, it is possible to reduce or shrink dimensions of a parts mount area of the system while at the same time simplifying the assembly/manufacturing procedure, in addition to the same effects obtained in said case shown in FIG. 4.

Figure 7:
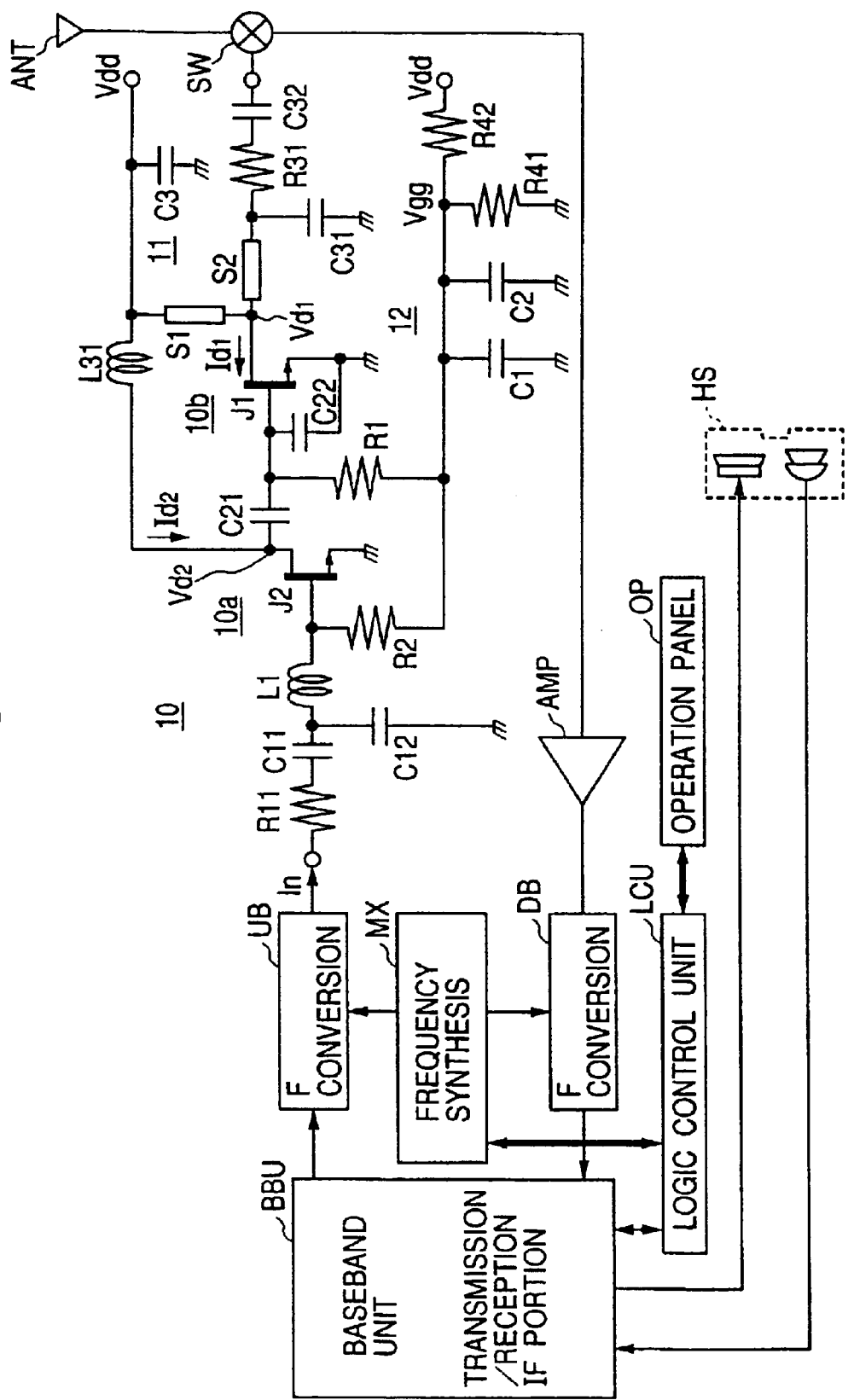
FIG. 7 is a diagram showing a configuration of a still another exemplary power amplifier system and a mobile communications terminal device employing the same.

In addition, FIG. 7 is a diagram showing a configuration of a still another exemplary power amplifier system and a mobile communications terminal device employing the same. The power amplifier system and the mobile communications terminal device employing this system shown in FIG. 7 are also substantially the same as those shown in FIG. 4. A difference of the former over the latter is that the high frequency power amplifier circuit unit 10 is not arranged as part of an MMIC and that respective elements are designed as separate independent components. In this way, these power amplifier system and mobile communications terminal device employing the same are also capable of obtaining virtually the same effects as in said case shown in FIG. 4.

Although the invention made by the inventors as named herein has been explained based on some preferred embodiments thereof, the present invention should not be limited to such embodiments only, and it will be apparent that various changes and modifications may be resorted to without departing from the spirit and scope of the invention.

For example, although in the above examples the gate electrodes 36 of the MESFETs J1, J2 are made of platinum, the electrodes may alternatively be made of any other suitable equivalent materials which are greater in work function than tungsten silicides, typically including palladium (Pd). Also note that although in the above embodiments the electron supply layer 34 of the channel section is comprised of AlGaAs, it will also be permissible that this electron supply layer is modified to comprise GaAs while modifying the gate electrodes 36 so that these are structured from a multilayer lamination of platinum/titanium/molybdenum/titanium/platinum/gold in this order of sequence from the lowermost layer thereof, in a way similar to that in said embodiment(s). At this time the Vf value with said definition falls within a range of 0.67 to 0.73 V. Even in such case, it is possible to gain the Vf value higher by about 0.1 V than that of the prior art device structure having gate electrodes made of tungsten silicides overlying GaAs, thereby enabling achievement of said similar technical advantages.

INDUSTRIAL APPLICABILITY

As has been stated above, the power amplifier system and the mobile communications terminal device incorporating the principles of the present invention are for providing a high frequency amplifying system capable of obtaining a sufficiently large output even in association with a single power supply, which will be especially adaptable preferably for use in mobile communications terminal devices capable of offering long term operabilities on a battery, such as PDC, PHS, and the like.

What is claimed is:

1. A power amplifier system comprising:

a Schottky barrier sate metal semiconductor field effect transistor ("MESFET") having a source, a drain and a gate electrode, wherein the gate electrode is formed on a semiconductor region so as to form a Schottky diode between the gate electrode and the semiconductor region, and a gate current flows as a forward direction current of the Schottky diode by increasing a gate bias voltage to be supplied to the gate electrode, and wherein materials of the gate electrode and the semiconductor region are arranged so that a gate bias voltage which is to be supplied to the gate electrode and which is defined by a gate current value of 100 microamperes ($\mu$A) per gate electrode width of 100 micrometers ($\mu$m) is greater than or equal in value to 0.65 volts (V); and a bias circuit arranged to receive a unipolar power supply, and to provide the gate bias voltage to be supplied to the gate electrode, wherein the MESFET amplifies an input signal superposed with the gate bias voltage provided from the bias circuit.

2. The power amplifier system as recited in claim 1, wherein said MESFET is a MESFET of shallow depression type or enhancement type.

3. The power amplifier system as recited in claim 1, wherein said MESFET has a channel region comprising a compound semiconductive material of direct transition type.

4. The power amplifier system as recited in claim 1, wherein the bias circuit includes a gate bias circuit for generating the gate bias voltage and a ripple filtering capacitor coupled to the gate bias circuit.

5. The power amplifier system as recited in claim 4, wherein said ripple filtering capacitor is provided outside of a semiconductor substrate having said MESFET formed thereon.

6. The power amplifier system as recited in claim 1, wherein an alloy of said gate electrode and the semiconductor region is formed between the gate electrode and the semiconductor region, and wherein the Schottky diode is formed between the alloy and the semiconductor region.

7. The power amplifier system as recited in claim 6, wherein the material of the gate electrode is greater in work function than tungsten silicides.

8. The power amplifier system as recited in claim 7, wherein the material of the gate electrode includes one of platinum (Pt) and palladium (Pd).

9. The power amplifier system as recited in claim 1, wherein said MESFET and a passive element which is used in the power amplifier system are formed on different respective semiconductor substrates.

10. The power amplifier system as recited in claim 1, wherein said MESFET and a passive element which is used in the power amplifier system are formed on a single semiconductor substrate.

11. The power amplifier system as recited in claim 1, wherein said MESFET, a passive element which is used in the power amplifier system and an output matching circuitry which is used in the power amplifier system are formed on a single semiconductor substrate.

12. A power amplifier system comprising:

a Schottky barrier gate metal semiconductor field effect transistor (MESFET) having a source, a drain and a gate electrode, wherein the gate electrode in formed on a semiconductor region so as to form a Schottky diode between the gate electrode and the semiconductor region, and a gate current flows as a forward direction current of the Schottky diode by increasing a voltage to be supplied to the gate electrode, and wherein materials of the gate electrode and the semiconductor region are arranged so that the voltage which is to be supplied to the gate electrode and which is defined by a gate current value of 100 microamperes ($\mu$A) per gate electrode width of 100 micrometers ($\mu$m) is greater than or equal in value to 0.63 volts (V); and a bias circuit arranged to receive a unipolar power supply, and to provide a gate bias voltage to be supplied to the gate electrode, wherein the MESFET amplifies an input signal superposed with the gate bias voltage.

13. The power amplifier system as recited in claim 12, wherein said MESFET has a channel region comprising a compound semiconductive material of direct transition type.

14. The power amplifier system as recited in claim 12, wherein the bias circuit includes a gate bias circuit and a ripple filtering capacitor coupled to the gate bias circuit.

15. The power amplifier system as recited in claim 12, wherein an alloy of said gate electrode and the semiconductor region is formed between the gate electrode and the semiconductor region, and wherein the Schottky diode is formed between the alloy and the semiconductor region.

16. The power amplifier system as recited in claim 15, wherein the material of the gate electrode is greater in work function than tungsten silicides.

17. The power amplifier system as recited in claim 16, wherein the material of the gate electrode includes one of platinum (Pt) and palladium (Pd).

18. The power amplifier system as recited in claim 12, wherein said MESFET and a passive element which is used in the power amplifier system are formed on different respective semiconductor substrates.

19. The power amplifier system as recited in claim 12, wherein said MESFET and a passive element which is used in the power amplifier system are formed on a single semiconductor substrate.

20. The power amplifier system as recited in claim 12, wherein said MESFET, a passive element which is used in the power amplifier system and an output matching circuitry which is used in the power amplifier system are formed on a single semiconductor substrate.

* * * * *